United States Patent
Lee et al.

(10) Patent No.: US 6,535,829 B2
(45) Date of Patent: Mar. 18, 2003

(54) SYSTEM FOR CALCULATING EXPOSURE ENERGY

(75) Inventors: Wen-Chih Lee, Chu-Pei (TW); Yu-Ming Chuang, Tai-Chung (TW)

(73) Assignee: United Microelectronics Corp., Hsin-Chu (TW)

( * ) Notice: Subject to any disclaimer, the term of this patent is extended or adjusted under 35 U.S.C. 154(b) by 100 days.

(21) Appl. No.: 09/878,370

(22) Filed: Jun. 12, 2001

(65) Prior Publication Data

US 2002/0188412 A1 Dec. 12, 2002

(51) Int. Cl.[7] ............................. G01N 21/33; G03F 9/00
(52) U.S. Cl. ......................... 702/84; 315/151; 355/53; 355/68
(58) Field of Search ........................... 702/84; 315/151, 315/158; 355/71, 53, 68, 69; 250/205

(56) References Cited

U.S. PATENT DOCUMENTS

| | | | | |
|---|---|---|---|---|
| 4,117,375 A | * | 9/1978 | Bachur et al. | 315/151 |
| 5,556,726 A | * | 9/1996 | Yuan | 430/30 |
| 5,786,116 A | * | 7/1998 | Rolfson | 430/5 |
| 5,831,330 A | * | 11/1998 | Chang | 257/620 |
| 5,883,704 A | * | 3/1999 | Nishi et al. | 355/67 |
| 5,999,247 A | * | 12/1999 | Tezuka | 355/71 |

\* cited by examiner

Primary Examiner—Kamini Shah
(74) Attorney, Agent, or Firm—Winston Hsu

(57) ABSTRACT

The present invention provides a system, comprising an exposure apparatus and a control mean electrically connected to the exposure apparatus, for calculating exposure energy ($E_e$). The control mean executes an exposure energy calculation program according to mask data, comprising an actual transparency percentage parameter ($T_a$) and a mask error, and a critical dimension (CD) specification, comprising at least a basic transparency percentage parameter ($T_b$), a transparency constant ($T_c$), a CD energy constant ($C_c$) and a basic exposure energy, to calculate the exposure energy and output the exposure energy to the exposure apparatus. In the exposure energy calculation program, the basic transparency percentage parameter ($T_b$) is firstly subtracted from the actual transparency percentage parameter ($T_a$). The resulting difference is then multiplied together with the transparency constant ($T_c$) parameter to calculate a transparency percentage difference energy. A mask error energy is calculated by multiplying together the CD energy constant ($C_c$) parameter with the mask error parameter. The summation of the transparency percentage difference energy, the mask error energy and the basic exposure energy is finally calculated so as to determine the exposure energy.

11 Claims, No Drawings

SYSTEM FOR CALCULATING EXPOSURE ENERGY

BACKGROUND OF THE INVENTION

1. Field of the Invention

The present invention relates to a system for calculating exposure energy ($E_e$), and more specifically, to a system executing an exposure energy calculation program, using mask test data and a critical dimension (DC) specification to calculate the exposure energy.

2. Description of the Prior Art

The photolithographic process is the most important step in semiconductor fabrication. It transfers the layout of a designed integrated circuit onto a semiconductor wafer. In order to form the desired integrated circuits a mask is made, followed by a circuit design pattern being formed on the mask. A photolithographic process is used to transfer the circuit design pattern onto a photoresist layer on the surface of the semiconductor wafer. The critical dimension (CD) of the pattern transferred onto the photoresist layer depends on a number of factors, including mask quality, CD specification, exposure energy ($E_e$), machine type and operational parameters. As the complexity and integration of semiconductor circuits increases, the size of the circuit design pattern on the photoresist layer decreases. Therefore, precision of the critical dimension becomes more and more important.

CD error, leading to a lower yield and product quality, is one of the key areas that needs improvement in the production of semiconductor devices. From numerous experiments it can be concluded that the after development inspection critical dimension (ADI CD) relates to the transparency, the ratio of the patterning area to the developing area, of the mask. Thus, the critical dimension can be controlled by varying the exposure energy, based on the transparency of the mask chosen, without changing the layout on the mask.

Currently, the proper exposure energy is normally attained by analyzing data from numerous experiments. Thus, overexposure or underexposure at the corners of the design patterns on the photoresist layer, leading to a loss of resolution that causes end-of-line shortening of the design pattern and the difference between the pattern transferred onto the photoresist layer and the actual design pattern, is prevented.

However, this currently applied method is inefficient due to the tremendous amount of resources spent on experiments and the complicated processing of the experimental data. It is indeed an important objective to find an alternative method of obtaining the proper exposure energy more efficiently, and precisely so as to shorten the pilot run period, increase product reliability and improve scrap reduction.

SUMMARY OF THE INVENTION

It is therefore a primary object of the present invention to provide a system of calculating exposure energy ($E_e$) to replace the method currently used so as to improve production efficiency and reliability.

In the preferred embodiment of the present invention, the system of calculating exposure energy comprises an exposure apparatus and a control mean, comprising a processor and a data storing apparatus, electrically connected to the exposure apparatus. By supplying a mask value, comprising an actual transparency percentage parameter ($T_a$) and a mask error, and a critical dimension (CD) specification, comprising at least a basic transparency percentage parameter ($T_b$), a transparency constant ($T_c$), a CD energy constant ($C_c$) and a basic exposure energy, $T_b$, $T_c$, $C_c$ and basic exposure energy is obtained after inputting a mask size parameter, a process name parameter, a layer parameter and a critical dimension parameter. An exposure energy calculation program is executed thereafter by subtracting the basic transparency percentage parameter ($T_b$) from the actual transparency percentage parameter ($T_a$) and multiplying together the resulting difference with the transparency constant ($T_c$) parameter to calculate a transparency percentage difference energy. A mask error energy is then calculated by multiplying together the CD energy constant ($C_c$) parameter with the mask error parameter. Finally the exposure energy is obtained by calculating the summation of the transparency percentage difference energy, the mask error energy and the basic exposure energy and transmitted to the exposure apparatus for the subsequent exposure process.

It is an advantage of the present invention against the prior art that the tremendous amount of resources spent on experiments and the efforts of onerous collecting, as well as the complicated calculation of the experimental data, can be saved. By settling the system for calculating exposure energy provided in the present invention, the proper exposure energy can be obtained more efficiently and precisely. The pilot run period can be thus be shortened with scrap reduction significantly improved, and the quality and the reliability of the product relatively increased as well.

These and other objectives of the present invention will no doubt become obvious to those of ordinary skill in the art after reading the following detailed description of the preferred embodiment, which is illustrated in the multiple figures and drawings.

DETAILED DESCRIPTION OF THE PREFERRED EMBODIMENT

In the present invention, a system for calculating exposure energy ($E_e$) is provided to replace the currently applied method for obtaining exposure energy in order to increase both efficiency and reliability in production. The system comprises an exposure apparatus and a control mean, including a processor for processing the exposure energy calculation program and a data storing apparatus for storing the critical dimension (CD) specification, electrically connected to the exposure apparatus.

A mask test data, comprising an actual transparency percentage parameter ($T_a$) and a mask error, and built by a mask test, provided by a mask seller or input by a user, is input into a mask database. A mask size parameter, a process name parameter, a layer parameter, and a critical dimension parameter are then input into the corresponding columns in a critical dimension (CD) specification that further comprises at least a basic transparency percentage parameter ($T_b$), a transparency constant ($T_c$), a CD energy constant ($C_c$) and a basic exposure energy. The data of the basic transparency percentage parameter ($T_b$), the transparency constant ($T_c$), the CD energy constant ($C_c$) and the basic exposure energy can thus be obtained by using the CD specification.

The user or the control mean can execute an exposure energy calculation program by subtracting the basic transparency percentage parameter ($T_b$) from the actual transparency percentage parameter ($T_a$), and multiplying together the resulting difference with the transparency constant ($T_c$) parameter to calculate a transparency percentage difference energy. Simultaneously a mask error energy is calculated by multiplying together the CD energy constant ($C_c$) parameter with the mask error parameter. Consequently, the exposure energy can be obtained by calculating the summation of the transparency percentage difference energy, the mask error energy and the basic exposure energy.

The equation for calculating the exposure energy can be expressed as follows:

$$E_e = T_c \times (T_a - T_b) + C_c \times \text{mask error} + \text{basic exposure energy}$$

Finally, the exposure energy obtained by the equation above is assessed and transmitted to the exposure apparatus for the subsequent exposure process if the value is within an acceptable range. If the value of the exposure energy obtained is not in the acceptable range, it will be flagged and sent to the operator.

In comparison with the prior art, the system for calculating exposure energy in the present invention can obtain the exposure energies of different masks more precisely and efficiently. The tremendous amount of resources spent on experiments and the efforts of onerous collecting as well as the complicated calculation of the experimental data can thus be saved. By settling the system provided in the present invention, the pilot run period can be shortened with scrap reduction significantly improved, resulting in increased quality and reliability of the product Those skilled in the art will readily observe that numerous modifications and alterations of the device may be made while retaining the teachings of the invention. Accordingly, the above disclosure should be construed as limited only by the metes and bound of the appended claims.

What is claimed is:

1. A system for calculating exposure energy, the system comprising:

an exposure apparatus; and a control mean, electrically connected to the exposure apparatus;

wherein the control mean executes an exposure energy calculation program according to mask test data and a critical dimension (CD) specification to calculate the exposure energy, and outputs the exposure energy to the exposure apparatus, the mask test data comprises an actual transparency percentage parameter, and a mask error, the CD specification comprises at least a basic transparency percentage parameter, a transparency constant ($T_c$), a CD energy constant ($C_c$), and a basic exposure energy, the exposure energy calculation program comprises:

(a) subtracting the basic transparency percentage parameter from the actual transparency percentage parameter, and multiplying together the resulting difference with the transparency constant ($T_c$) parameter to calculate a transparency percentage difference energy;

(b) multiplying together the CD energy constant ($C_c$) parameter with the mask error parameter to calculate a mask error energy;

(c) calculating the summation of the transparency percentage difference energy, the mask error energy, and the basic exposure energy so as to calculate the exposure energy.

2. The system of claim 1 wherein the control mean comprises a processor for processing the exposure energy calculation program, and a data storing apparatus for storing the critical dimension (CD) specification.

3. The system of claim 1 wherein the mask test data is read from a mask database, and the mask database is built by a mask test or is provided by a mask seller.

4. The system of claim 1 wherein the mask test data is input by a user.

5. The system of claim 1 wherein the critical dimension (CD) specification further comprises a mask size parameter, a process name parameter, a layer parameter, and a critical dimension parameter.

6. The system of claim 5 wherein the control mean uses the CD specification to figure out the basic transparency percentage parameter, the transparency constant ($T_c$), the CD energy constant ($C_c$), and the basic exposure energy according to the mask size parameter, the process name parameter, the layer parameter, and the critical dimension parameter.

7. A method for calculating exposure energy, the method comprising:

(a) providing mask test data, the mask test data comprises an actual transparency percentage parameter and a mask error;

(b) providing a critical dimension (CD) specification, the CD specification comprises at least a basic transparency percentage parameter, a transparency constant ($T_c$), a CD energy constant ($C_c$), and a basic exposure energy;

(c) subtracting the basic transparency percentage parameter from the actual transparency percentage parameter, and multiplying together the resulting difference with the transparency constant ($T_c$) parameter to calculate a transparency percentage difference energy;

(d) multiplying together the CD energy constant ($C_c$) parameter with the mask error parameter to calculate a mask error energy;

(e) calculating the summation of the transparency percentage difference energy, the mask error energy, and the basic exposure energy so as to calculate the exposure energy.

8. The method of claim 7 wherein the mask test data is read from a mask database, and the mask database is built by a mask test or is provided by a mask seller.

9. The method of claim 7 wherein the mask test data is input by a user.

10. The method of claim 7 wherein the critical dimension (CD) specification further comprises a mask size parameter, a process name parameter, a layer parameter, and a critical dimension parameter.

11. The method of claim 10 wherein the control mean uses the CD specification to figure out the basic transparency percentage parameter, the transparency constant ($T_c$), the CD energy constant ($C_c$), and the basic exposure energy according to the mask size parameter, the process name parameter, the layer parameter, and the critical dimension parameter.

* * * * *